US012772495B2

(12) United States Patent
Chen et al.

(10) Patent No.: US 12,772,495 B2
(45) Date of Patent: Oct. 20, 2026

(54) SILICON CARBIDE SEMICONDUCTOR POWER TRANSISTOR AND METHOD OF MANUFACTURING THE SAME

(71) Applicant: LEAP Semiconductor Corp., Taoyuan City (TW)

(72) Inventors: Wei-Fan Chen, Taichung City (TW); Kuo-Chi Tsai, Taoyuan City (TW)

(73) Assignee: LEAP Semiconductor Corp., Taoyuan City (TW)

( * ) Notice: Subject to any disclaimer, the term of this patent is extended or adjusted under 35 U.S.C. 154(b) by 510 days.

(21) Appl. No.: 17/882,628

(22) Filed: Aug. 8, 2022

(65) Prior Publication Data

US 2024/0047569 A1 Feb. 8, 2024

(51) Int. Cl.

*H10D 62/10* (2025.01)
*H10D 12/01* (2025.01)
(Continued)

(52) U.S. Cl.

CPC ......... *H10D 30/668* (2025.01); *H10D 12/031* (2025.01); *H10D 62/107* (2025.01);
(Continued)

(58) Field of Classification Search

CPC ............... H01L 29/7813; H01L 29/045; H01L 29/0623; H01L 29/0865; H01L 29/1095;
(Continued)

(56) References Cited

U.S. PATENT DOCUMENTS 5,895,939 A * 4/1999 Ueno .................. H01L 29/0623 257/280
6,008,520 A 12/1999 Darwish et al.
(Continued)

FOREIGN PATENT DOCUMENTS

| | | |
|---|---|---|
| EP | 2879186 | 6/2015 |
| JP | 5668576 | 2/2015 |

OTHER PUBLICATIONS

"Office Action of Taiwan Counterpart Application", issued on Mar. 27, 2023, p. 1-p. 4.

(Continued)

*Primary Examiner* — Marlon T Fletcher
*Assistant Examiner* — Sesha Sairaman Srinivasan
(74) *Attorney, Agent, or Firm* — JCIPRNET

(57) ABSTRACT

A silicon carbide semiconductor power transistor includes a silicon carbide substrate, a first drift layer, a second drift layer on the substrate with V-grooves, buried doped regions in the first drift layer below the V-grooves, gates in the V-grooves, a gate insulation layer, a delta doping layer, a well region, source regions, well pick-up regions, conductive trenches, and doping portions. Each of the buried doped regions is a predetermined distance from a bottom of each of the V-grooves. The delta doping layer is disposed in the second drift layer, and the V-grooves are across the delta doping layer. The conductive trenches are disposed in the second drift layer, and each of the conductive trenches passes through the well pick-up regions and contacts with the well region. The doping portions are respectively on sidewalls of the conductive trenches in the well region.

20 Claims, 15 Drawing Sheets

(51) Int. Cl.

| | |
|---|---|
| ***H10D 30/01*** | (2025.01) |
| ***H10D 30/65*** | (2025.01) |
| ***H10D 30/66*** | (2025.01) |
| ***H10D 62/13*** | (2025.01) |
| ***H10D 62/17*** | (2025.01) |
| ***H10D 62/40*** | (2025.01) |
| ***H10D 62/81*** | (2025.01) |
| ***H10D 62/832*** | (2025.01) |
| ***H10D 64/01*** | (2025.01) |
| ***H10D 64/23*** | (2025.01) |
| ***H10D 64/27*** | (2025.01) |

(52) U.S. Cl.
CPC ......... *H10D 62/154* (2025.01); *H10D 62/393* (2025.01); *H10D 62/405* (2025.01); *H10D 62/8325* (2025.01); *H10D 64/01* (2025.01); *H10D 64/513* (2025.01)

(58) Field of Classification Search
CPC ............... H01L 29/1608; H01L 29/401; H01L 29/4236; H01L 29/66068; H01L 29/12; H01L 29/42376; H01L 29/0696; H01L 29/0878; H01L 29/41766; H01L 29/66704; H01L 29/7825; H10D 30/668; H10D 12/031; H10D 62/107; H10D 62/154; H10D 62/393; H10D 62/405; H10D 62/8325; H10D 64/01; H10D 64/513; H10D 64/518; H10D 62/127; H10D 62/157; H10D 62/81; H10D 64/256; H10D 30/0289; H10D 30/658
See application file for complete search history.

(56) References Cited

U.S. PATENT DOCUMENTS

| | | | | |
|---|---|---|---|---|
| 6,117,135 | A | 9/2000 | Schlapfer | |
| 6,194,741 | B1 * | 2/2001 | Kinzer | H10D 12/031 257/E29.081 |
| 10,177,233 | B2 | 1/2019 | Saitoh et al. | |
| 10,186,610 | B2 | 1/2019 | Kobayashi et al. | |
| 10,236,372 | B2 | 3/2019 | Okumura et al. | |
| 10,468,509 | B2 | 11/2019 | Okumura | |
| 10,490,658 | B2 | 11/2019 | Knoll et al. | |
| 10,522,672 | B2 | 12/2019 | Kumagai | |
| 2003/0080381 | A1 * | 5/2003 | Parthasarathy | H03K 17/08 257/E29.328 |
| 2006/0220026 | A1 * | 10/2006 | Uchida | H10D 64/693 257/E29.259 |
| 2009/0166686 | A1 * | 7/2009 | Hunt | H10K 85/00 257/E21.409 |
| 2009/0189228 | A1 * | 7/2009 | Zhang | H10D 12/031 257/E21.409 |
| 2010/0127275 | A1 * | 5/2010 | Takehiko | H10D 30/015 257/E21.441 |
| 2011/0233623 | A1 * | 9/2011 | Park | H01L 29/365 438/290 |
| 2011/0254010 | A1 | 10/2011 | Zhang | |
| 2013/0001592 | A1 * | 1/2013 | Miyahara | H01L 29/4236 257/77 |
| 2013/0134442 | A1 * | 5/2013 | Wada | H01L 29/7813 257/77 |
| 2013/0270576 | A1 * | 10/2013 | Masuda | H01L 29/66068 257/77 |
| 2013/0270577 | A1 | 10/2013 | Harris et al. | |
| 2014/0027784 | A1 * | 1/2014 | Wada | H10D 12/031 257/77 |
| 2015/0255575 | A1 * | 9/2015 | Wang | H10D 30/021 257/288 |
| 2015/0263181 | A1 * | 9/2015 | Berger | G11C 11/40603 257/104 |
| 2015/0295048 | A1 * | 10/2015 | Hiyoshi | H01L 29/7813 257/77 |
| 2016/0141415 | A1 * | 5/2016 | Lim | H01L 29/0653 257/339 |
| 2018/0114843 | A1 * | 4/2018 | Saitoh | H01L 22/10 |
| 2018/0166530 | A1 * | 6/2018 | Lichtenwalner | H01L 21/046 |
| 2021/0083095 | A1 * | 3/2021 | Chang | H10D 30/0212 |
| 2022/0246745 | A1 * | 8/2022 | Siemieniec | H10D 12/031 |

OTHER PUBLICATIONS

T. Hirao; et al., "4H—SiC MOSFETs on (03-38) Face," Materials Science Forum, vols. 389-393, Apr. 2002, pp. 1065-1068.

Toru Hiyoshi; et al., "SiC high channel mobility MOSFET," SEI Technical Review, No. 77, Oct. 2013, pp. 122-126.

Hidenori Koketsu; et al., "Shape Control of Trenched 4H—SiC C-Face by Thermal Chlorine Etching," Japanese Journal of Applied Physics, vol. 51, No. 5, May 2012, pp. 1-6.

Yu Saitoh; et al., "V-groove trench gate SiC MOSFET with a double reduced surface field junction termination extensions structure," Japanese Journal of Applied Physics, vol. 58, No. SB, Mar. 2019, pp. 1-7.

Keita Tachiki et al., "Short-Channel Effects in SiC MOSFETs Based on Analyses of Saturation Drain Current," in IEEE Transactions on Electron Devices, vol. 68, No. 3, Mar. 2021, pp. 1382-1384.

I. O. Usov; et al., "Diffusion of boron in 6H and 4H SiC coimplanted with boron and nitrogen ions," Journal of Applied Physics, vol. 96, No. 9, Nov. 2004, pp. 4960-4964.

Ilkham G. Atabaev; et al., "Influence of Defects on Low Temperature Diffusion of Boron in SiC," Materials Sciences and Applications vol. 2, No. 9, Sep. 2011, pp. 1205-1211.

* cited by examiner

SILICON CARBIDE SEMICONDUCTOR POWER TRANSISTOR AND METHOD OF MANUFACTURING THE SAME

BACKGROUND

Technical Field

The disclosure relates to a silicon carbide semiconductor power transistor, and particularly relates to a silicon carbide semiconductor power transistor and a method of manufacturing the same.

Description of Related Art

High voltage, field effect transistors, also known as power transistors or silicon carbide semiconductor power transistors, are well known in the semiconductor arts. Vertical power transistor including an extended drain or drift region can support the applied high voltage when the device is in the “off” state, and this type power transistor are commonly used in power conversion applications such as AC/DC converters for offline power supplies, motor controls, and so on. These power transistor devices can be switched at high voltages and achieve a high blocking voltage in the “off” state while minimizing the resistance to current flow between the drain and the source, often referred to as the specific on resistance ($R_{on}$), in the “on” state.

Silicon carbide (SiC) MOSFETs are highly noticed due to their superior physical properties over silicon-based devices of the same device area. For example, SiC MOSFETs are known to exhibit higher blocking voltage, lower $R_{on}$, and higher thermal conductivity as compared to silicon MOSFETs.

4H—SiC MOSFETs are promising building blocks for low loss and high voltage switching power modules. One of the key challenges for 4H—SiC power MOSFETs is to achieve both low specific on-resistance and high threshold voltage at the same time. This is because the nitridation process, which is generally used after gate oxidation in order to reduce the channel resistance, typically ends up with a lower threshold voltage rather than high channel mobility. A 4H—SiC (03–38) channel orientation has been researched for the formation of MOSFETs on v-grooves to overcome above problems. However, those MOSFETs suffer from low breakdown voltage and low Short Current Characteristic performance due to the high electric field at the bottom of the v-grooves.

SUMMARY

The disclosure provides a silicon carbide semiconductor power transistor for reducing specific on resistance ($R_{on}$) without compromising breakdown voltage.

The disclosure further provides a method of manufacturing a silicon carbide semiconductor power transistor to lower $R_{on}$ without complicated processing steps.

The silicon carbide semiconductor power transistor of the disclosure includes a substrate made of silicon carbide (SiC), a first drift layer disposed on a plane of the substrate, a second drift layer formed on the first drift layer, a plurality of buried doped regions disposed in the first drift layer, a plurality of gates, a gate insulation layer, a delta doping layer disposed in the second drift layer, a well region disposed on the delta doping layer in the second drift layer, a plurality of source regions disposed in the well region, and a plurality of well pick-up regions disposed in the second drift layer, a plurality of conductive trenches, and a plurality of doping portions. A plurality of V-grooves is formed in the second drift layer, the V-grooves are parallel to each other, and the V-grooves are across the delta doping layer. The plurality of buried doped regions is disposed below the plurality of V-grooves, and each of the buried doped regions is a predetermined distance from a bottom of each of the V-grooves. The gates are disposed in the V-grooves of the second drift layer, and the gate insulation layer is disposed between the second drift layer and each of the gates. The source regions are between the V-grooves, wherein the source regions and the buried doped regions are electrically connected. Each of the well pick-up regions passes through the source region and contacts with the well region. The conductive trenches are disposed in the second drift layer, and each of the conductive trenches passes through the well pick-up regions and contacts with the well region. The doping portions are on sidewalls of the conductive trenches in the well region.

In an embodiment of the disclosure, the plane of the substrate is a {0001} plane, a {11–20} plane, or a {1100} plane.

In an embodiment of the disclosure, the plane of the substrate has an off-axis orientation equal to 5° or less.

In an embodiment of the disclosure, a tilt angle between a sidewall and the bottom of each of the V-grooves is 30° to 65°.

In an embodiment of the disclosure, the substrate, the first drift layer, the second drift layer, the delta doping layer, and the source regions have a first conductive type, and the well region, the well pick-up regions and the buried doped regions have a second conductive type.

In an embodiment of the disclosure, the dopants in the delta doping layer is at least one selected from Si, Ge, and Sn.

In an embodiment of the disclosure, the silicon carbide semiconductor power transistor further includes a strap of doped region disposed in the first drift layer and the second drift layer to connect the source regions and the buried doped regions.

In an embodiment of the disclosure, the strap of doped region has an extension direction perpendicular to an extension direction of the plurality of V-grooves.

In an embodiment of the disclosure, the gates are symmetrically disposed on both sides of the strap of doped region.

In an embodiment of the disclosure, a doping concentration of the well region is ranged from $5E15/cm^3$ to $1E18/cm^3$.

In an embodiment of the disclosure, a doping concentration of the plurality of buried doped regions is ranged from $5E15/cm^3$ to $1E18/cm^3$.

In an embodiment of the disclosure, a width of each of the buried doped regions is 1.5-2.0 times than a width of the bottom of each of the V-grooves.

In an embodiment of the disclosure, a depth of an upper surface of the buried doped regions in the first drift layer is 0.2 μm to 1.5 μm, and the predetermined distance is 0.3 μm to 1 μm.

In an embodiment of the disclosure, the silicon carbide semiconductor power transistor further includes source electrodes, gate electrodes and drain electrode. The source electrodes are disposed on the second drift layer to be in direct contact with the well pick-up regions and the source regions. The gate electrodes are disposed on the plurality of gates. The drain electrode is disposed on a back of the substrate.

The method of manufacturing the silicon carbide semiconductor power transistor includes forming a first drift layer on an upper surface of a silicon carbide (SiC) substrate, and then forming a plurality of buried doped regions in the first drift layer, and the buried doped regions are parallel to each other. A second drift layer is formed on the first drift layer to cover the plurality of buried doped regions, and a delta doping layer is formed in a surface of the second drift layer. A doped epitaxy layer as a well region is formed on the delta doping layer, and then a strap of doped region is formed through the delta doping layer from a surface of the doped epitaxy layer to the plurality of buried doped regions. A source region is formed in the surface of the doped epitaxy layer, wherein the source region and the buried doped regions are electrically connected via the strap of doped region. A plurality of well pick-up regions is formed in the surface of the doped epitaxy layer between the buried doped regions to pass through the source region and contact with the well region. Thereafter, a plurality of V-grooves is formed in the doped epitaxy layer and the second drift layer over the buried doped regions, wherein the V-grooves pass through the source region, the well region, and the delta doping layer, and each of the buried doped regions is a predetermined distance from a bottom of each of the V-grooves. A plurality of conductive trenches is formed in the second drift layer to pass through the plurality of well pick-up regions and contact with the well region. A plurality of doping portions is formed on sidewalls of the plurality of conductive trenches in the well region. A gate insulation layer is formed in the plurality of V-grooves, and then a plurality of gates is formed on the gate insulation layer.

In another embodiment of the disclosure, after forming the gates, the method further includes forming a plurality of source electrodes and a plurality of gate electrodes. The source electrodes are disposed on the doped epitaxy layer to be in direct contact with the plurality of well pick-up regions and the source region, and the gate electrodes are disposed on the plurality of gates.

In another embodiment of the disclosure, after forming the source electrodes and the gate electrodes, the method further includes forming a drain electrode on a bottom surface of the SiC substrate.

In another embodiment of the disclosure, the upper surface of the SiC substrate is a {0001} plane, a {11−20} plane, or a {1100} plane.

In another embodiment of the disclosure, the upper surface of the SiC substrate has an off-axis orientation equal to 5° or less.

In another embodiment of the disclosure, the step of forming the V-grooves includes forming a tilt angle of 30° to 65° between a sidewall and the bottom of each of the V-grooves.

Based on the above, according to the silicon carbide semiconductor power transistor of the disclosure, the gates are formed in the V-grooves of the drift layer, and the buried doped regions are disposed below the V-grooves and separate from the bottom of each V-grooves. Accordingly, the buried doped regions equal potential with the source regions can shield the high electrical field below the gate insulation layer at the bottom of the V-groove, and provide extra current flow path for reducing the effective JFET resistance ($R_{JFET}$) of the silicon carbide semiconductor power transistor.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
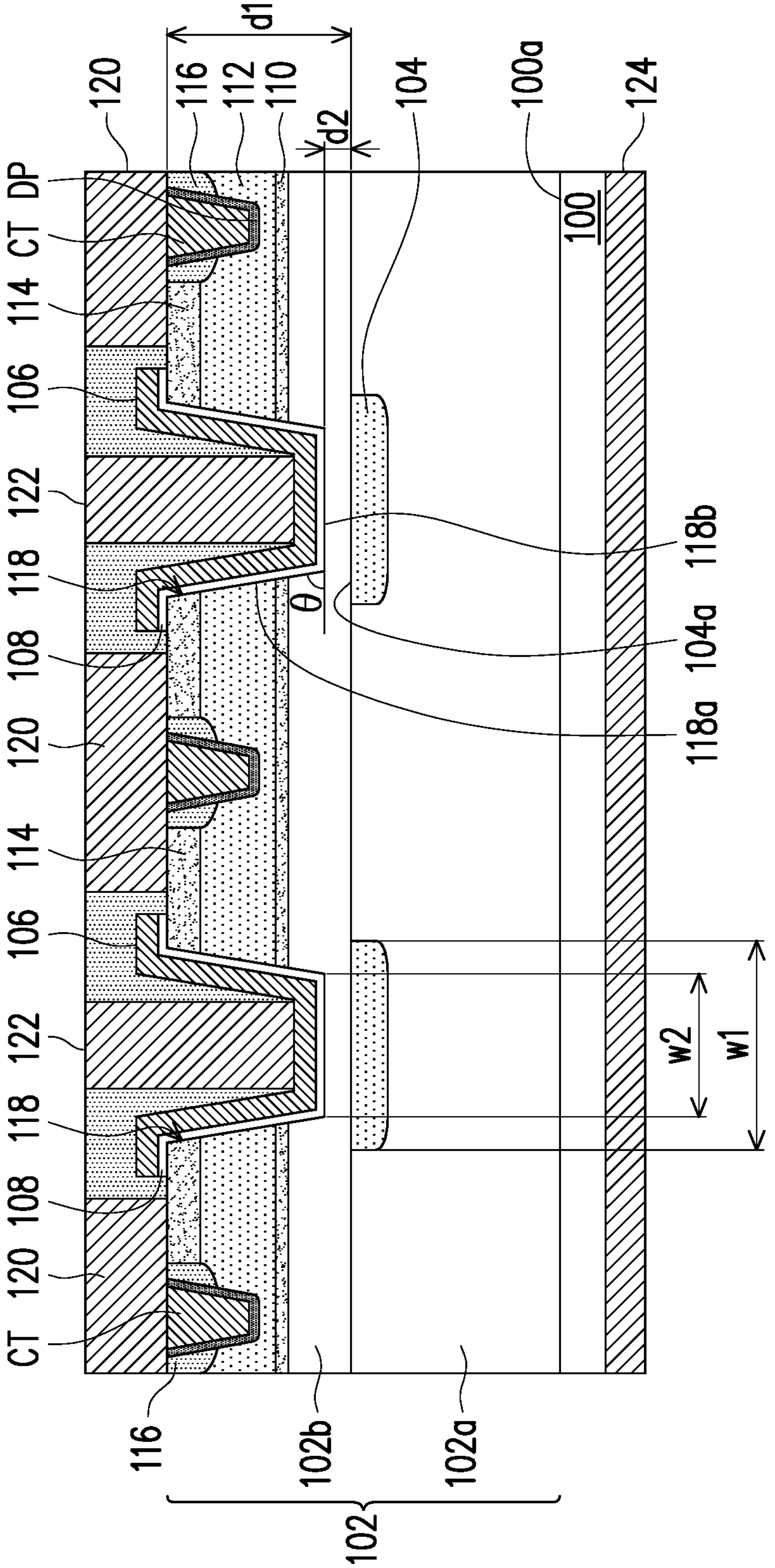
FIG. 1A is a cross-sectional view of a silicon carbide semiconductor power transistor according to a first embodiment of the disclosure.

With reference to the drawings attached, the disclosure will be described by means of the embodiments below. Nevertheless, the disclosure may be embodied in many different forms and should not be construed as limited to the embodiments set forth herein. In the drawings, for the purpose of clarity and specificity, the sizes and the relative sizes of each layer and region may not be illustrated in accurate proportion.

FIG. 1A is a cross-sectional view of a silicon carbide semiconductor power transistor according to a first embodiment of the disclosure.

Referring to FIG. 1A, the silicon carbide semiconductor power transistor of the first embodiment includes at least a substrate 100 made of silicon carbide (SiC), a first drift layer 102*a* disposed on a plane 100*a* of the substrate 100, a second drift layer 102*b* formed on the first drift layer 102*a*, a plurality of buried doped regions 104 disposed in the first drift layer 102*a*, a plurality of gates 106, a gate insulation layer 108, a delta doping layer 110 disposed in the second drift layer 102*b*, a well region 112 disposed on the delta doping layer 110 in the second drift layer 102*b*, a plurality of source regions 114 disposed in the well region 112, a plurality of well pick-up regions 116 disposed in the second drift layer 102*b*, a plurality of conductive trenches CT, and a plurality of doping portions DP. In one embodiment, the plane 100*a* of the substrate 100 is a {0001} plane, a {11−20} plane, or a {1100} plane. Moreover, the plane 100*a* of the substrate 100 has an off-axis orientation equal to 5° or less, preferably, 3° or less. In one embodiment, the first drift layer 102*a* and the second drift layer 102*b* may be formed on the plane 100*a* of the substrate 100 by epitaxial growth, and the first drift layer 102*a* and the second drift layer 102*b* can act as an entire drift layer 102.

Referring to FIG. 1A again, a plurality of V-grooves 118 is formed in the second drift layer 102*b*, the V-grooves 118 are parallel to each other, and the V-grooves 118 are across the delta doping layer 110. In one embodiment, a tilt angle θ between a sidewall 118*a* and a bottom 118*b* of each of the V-grooves 118 is, for example, 30° to 65°. Moreover, For improvement of channel mobility and high weak inversion threshold, the sidewall 118*a* may be a (03−38) plane which represents the face tilted by 54.7° toward the direction from (0001) plane and tilted by 35.3° toward the direction from (1120) plane. The buried doped regions 104 are disposed below the V-grooves 118, and thus the buried doped regions 104 are also parallel to each other. Each of the buried doped regions 104 has a predetermined distance d2 from the bottom 118*b* of each of the V-grooves 118. The source regions 114 are between the V-grooves 118, wherein the source regions 114 and the buried doped regions 104 are electrically connected via the interconnections (not shown), and thus the buried doped regions 104 are equal potential with the source regions 114 (e.g. OV) so as to solve the problem of high electrical field below the gate insulation layer 108 at the bottom 118*b* of the V-groove 118.

In one embodiment, if the doping concentration of the buried doped regions 104 is as high as 1E18/cm$^3$, and the predetermined distance d2 is 0.3 μm to 1 μm, there are two functions of the buried PN junction. One is to shield the high electrical field below the gate insulation layer 108 at the bottom 118*b* of the V-groove 118 without the potential p-well and buried p-well punch through concern. The other is to provide extra current flow path as shown in FIG. 1B.

Figure 1B:
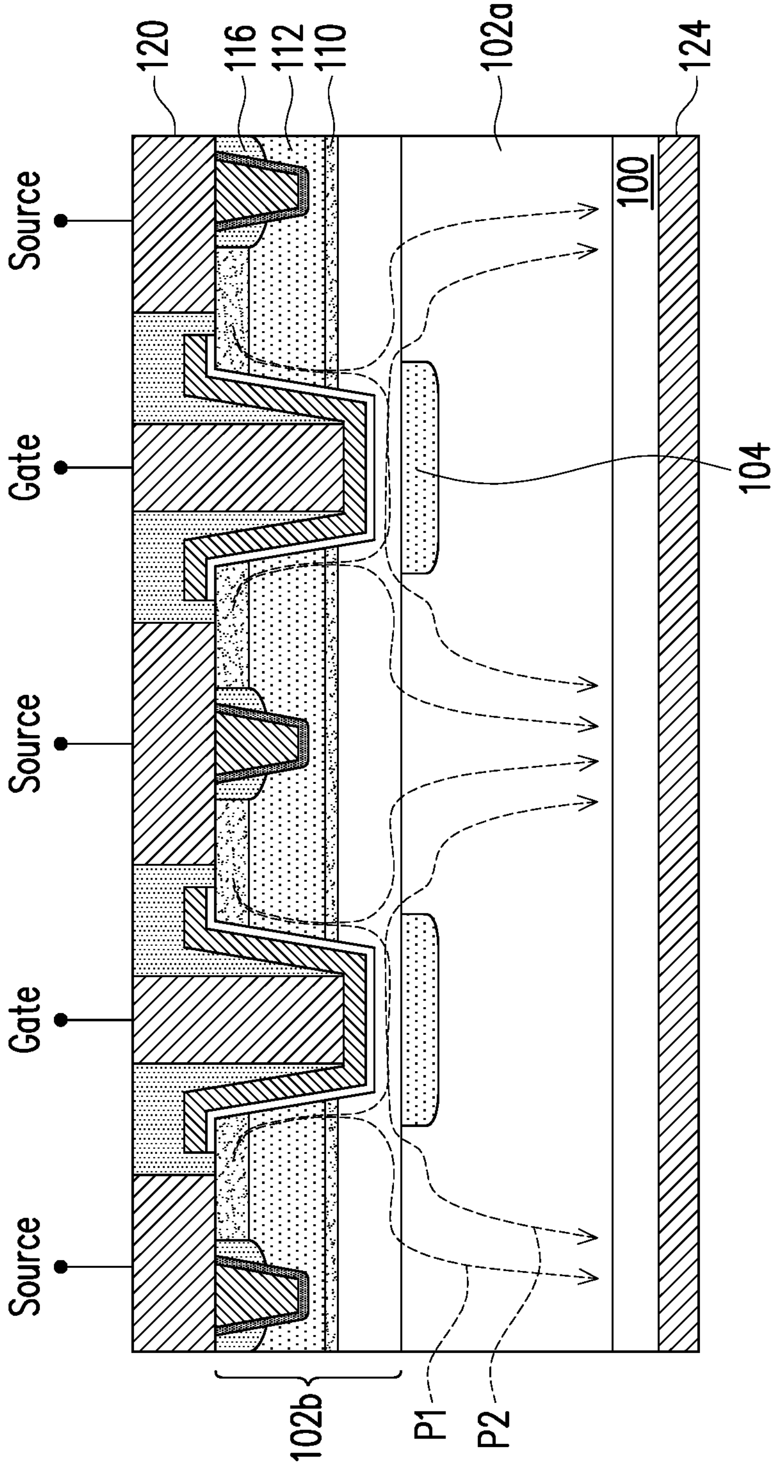
FIG. 1B shows the silicon carbide semiconductor power transistor of FIG. 1A in the on state.

FIG. 1B shows the silicon carbide semiconductor power transistor of FIG. 1A in the on state, wherein some reference symbols and labeled representations are omitted to clear the electrical property in the silicon carbide semiconductor power transistor. In FIG. 1B, the current flow paths P1 and P2 can reduce the effective JFET resistance ($R_{JFET}$) of the silicon carbide semiconductor power transistor because $R_{JFET}=R_{JFET1}//R_{JFET2}$. Therefore, the reliability and $RDS_{on}$ of the silicon carbide semiconductor power transistor can be improved. The current flow path P1 is from "Source" to the drain electrode 124 directly, and the current flow path P2 is from "Source" to the drain electrode 124 via the second drift layer 102*b* over the upper surface of the buried doped regions 104.

In FIG. 1A, each of the well pick-up regions 116 passes through the source regions 114 and contacts with the well region 112. The gates 106 are disposed in the V-grooves 118 of the second drift layer 102*b*, and the gate insulation layer 108 is disposed between the second drift layer 102*b* and each of the gates 106. For example, the gates 106 are polysilicon and conformally deposited on the sidewall 118*a* and the bottom 118*b* of each V-groove 118. For example, the thickness of the gate insulation layer 108 is ranged from 250 Å to 1,000 Å. The gates 106 extend to the top of the second drift layer 102*b* outside the V-groove 118, but the disclosure is not limited herein; in other embodiment, the gates 106 may not extend to the top of the second drift layer 102*b*. In the first embodiment, a width w1 of each of the buried doped regions 104 is 1.5-2.0 times than a width w2 of the bottom 118*b* of each of the V-grooves 118. The term "width" refers to the distance between two sides of the buried doped region 104 or the bottom 118*b* in the cross-sectional view of the substrate 100. In one embodiment, the width w1 of each of the buried doped regions 104 is, for instance, 1 μm to 1.5 μm, and the width w2 of the bottom 118*b* is, for instance, 0.1 μm to 0.6 μm. In an embodiment of the disclosure, a depth d1 of an upper surface 104*a* of the buried doped regions 104 in the first drift layer 102*a* is 0.2 μm to 1.5 μm, and the predetermined distance d2 is 0.3 μm to 1 μm. The conductive trenches CT are disposed in the second drift layer 102*b*, and each of the conductive trenches CT passes through the well pick-up region 116 and contacts with the well region 112, wherein each of the conductive trenches CT is made of conductive material in order to reduce the potential snapback effect of the silicon carbide semiconductor power transistor. The snapback of the silicon carbide semiconductor power transistor is detrimental and may cause permanent damage. The doping portions DP are respectively on the sidewalls of the conductive trenches CT in the well region 112 to improve the conductivity between the conductive trench CT and the well region 112. In FIG. 1A, the doping portion DP may be further below the bottom of the conductive trench CT.

The substrate 100, the first drift layer 102*a*, the second drift layer 102*b*, the delta doping layer 110, and the source regions 114 have a first conductive type; the well region 112, the well pick-up regions 116, the doping portions DP, and the buried doped regions 104 have a second conductive type. For example, the substrate 100, the first drift layer 102*a*, the second drift layer 102*b*, the delta doping layer 110 and the source regions 114 are N type, and the well region 112, the well pick-up regions 116, the doping portions DP, and the buried doped regions 104 are P type. The doping concentration of the plurality of buried doped regions 104 is ranged from 5E15/cm$^3$ to 1E18/cm$^3$, for instance. The doping concentration of the well region 112 is ranged from 5E15/cm$^3$ to 1E18/cm$^3$, and the thickness (or depth) of the well region 112 is 0.5 μm to 1.5 μm, for instance. The doping concentration of the source region 114 is 1E17/cm$^3$ to 1E19/cm$^3$, for instance. The doping concentration of the well pick-up regions 116 is 1E18/cm$^3$ to 2E20/cm$^3$, for instance. The doping concentration of the doping portions DP is ranged from 1E19/cm$^3$ to 5E19/cm$^3$, for instance.

Moreover, the delta doping layer 110 can be effective to limit the variation of p-well (the well region 112) junction profile variation by ambiguous intrinsic and extrinsic defect in the mass production. The dopants in the delta doping layer 110 is at least one selected from Si, Ge, and Sn, for instance. The thickness of the delta doping layer 110 is 1,000 Å to 3,000 Å, and the doping concentration of the delta doping layer 110 is 1E17/cm$^3$ to 5E18/cm$^3$, for instance.

In the first embodiment, the silicon carbide semiconductor power transistor further includes source electrodes 120, gate electrodes 122, and drain electrode 124. The source electrodes 120 are disposed on the second drift layer 102*b* to be in direct contact with the well pick-up regions 116 and the source regions 114. The gate electrodes 122 are disposed on the gates 106. The drain electrode 124 is disposed on a back of the substrate 100.

Figure 2:
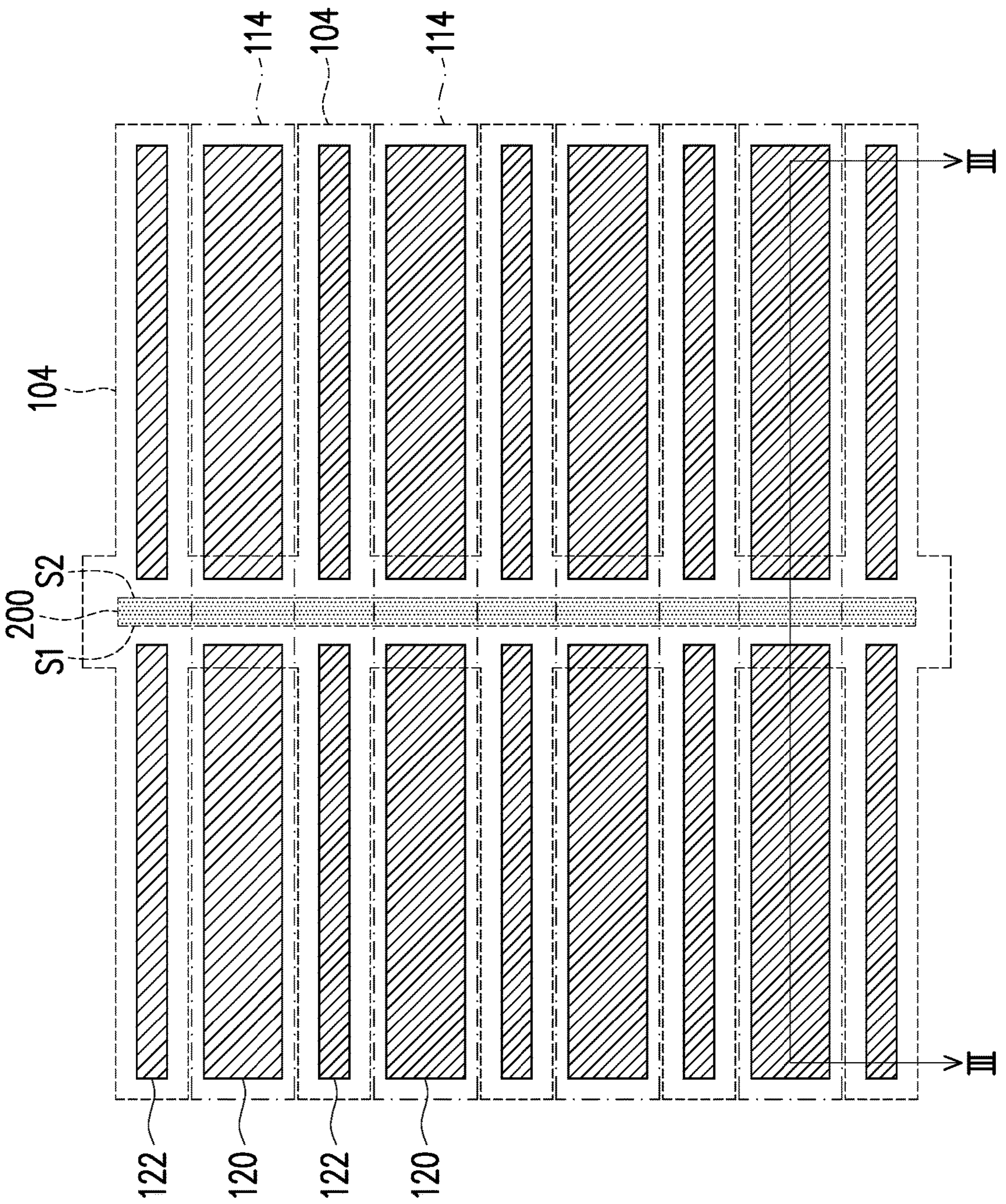
FIG. 2 is a plane view of the silicon carbide semiconductor power transistor of FIG. 1A.
Figure 3:
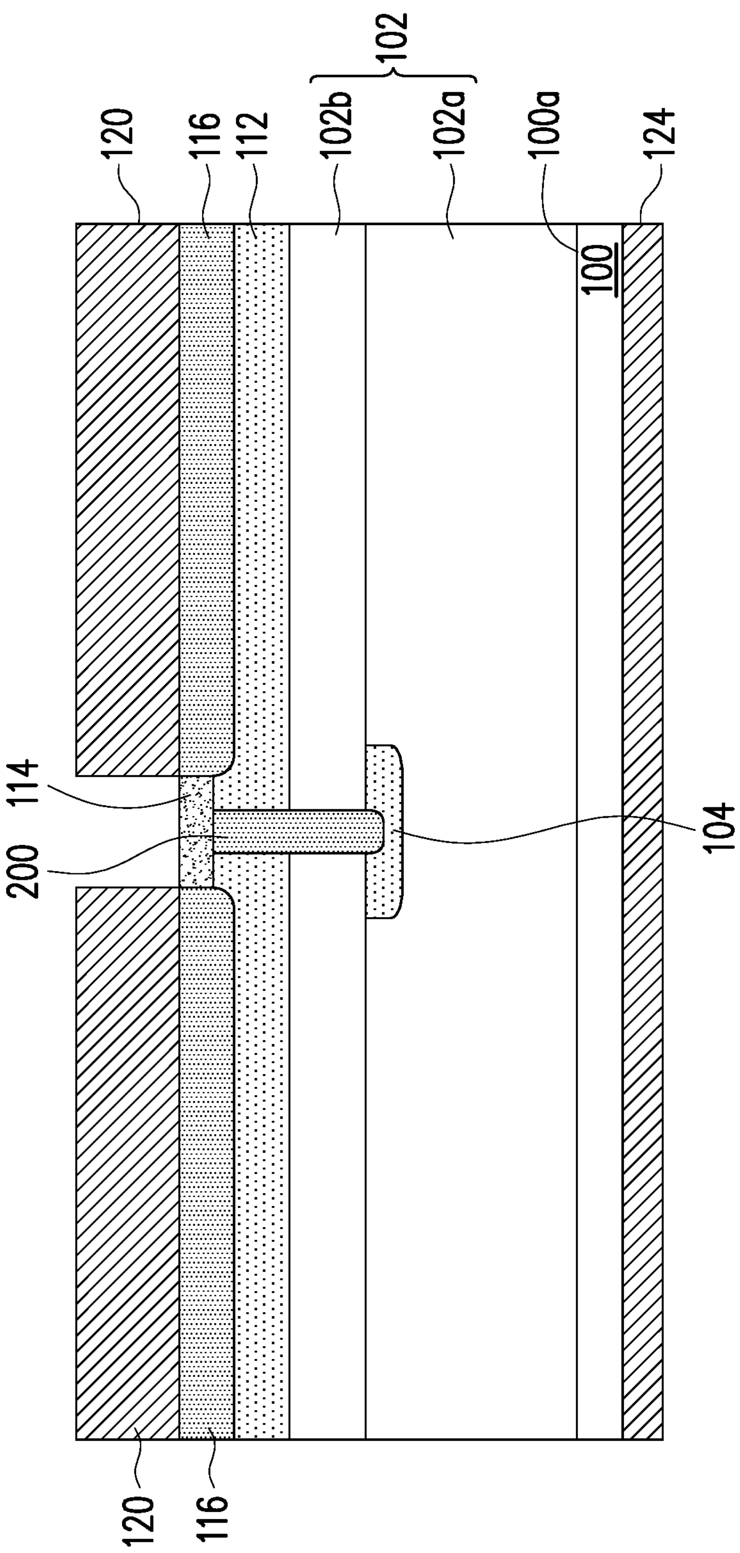
FIG. 3 is a cross-sectional view along the III-III line of FIG. 2.

In this embodiment, the source regions 114 and the buried doped regions 104 are electrically connected. For example, the buried doped regions 104 are connected through a strap of doped region 200 to the $V_{SS}$ node of the silicon carbide semiconductor power transistor. As shown in FIG. 2 which is a plane view of FIG. 1A, the strap of doped region 200 is formed to connect the plurality of source regions 114 and the plurality of buried doped regions 104, wherein some elements are omitted in FIG. 2 to clarify the positional relationship of the buried doped regions 104, the source regions 114, the gate electrodes 122, and so on. The strap of doped region 200 may be disposed in the drift layer 102 as shown FIG. 3 which is a cross-sectional view along the III-III line of FIG. 2. The strap of doped region 200 may be doped in the well region 112 before the formation of the source regions 114. The doping concentration of the strap of doped region 200 is ranged from 2E19/cm$^3$ to 1E20/cm$^3$, for instance.

In FIG. 2, the strap of doped region 200 has an extension direction perpendicular to an extension direction of the plurality of gates 122, and the gates 122 can be designed to be symmetrically disposed on both sides S1 and S2 of the strap of doped region 200. In other words, the extension direction of the strap of doped region 200 is perpendicular to the extension direction of the V-grooves (118) below the gates 122. Therefore, the strap of doped region 200 does not affect the current flow in the first drift layer 102*a* in FIG. 1B; in other words, there is no issue of electric field crowding at the bottom of the V-grooves. The strap of doped region 200 is a continuous region in FIG. 2, but the disclosure is not limited herein; in another embodiment, the strap of doped region 200 may divide into several sub-regions distributed from top to bottom of FIG. 2, and each of the sub-regions connects one of source regions 114 and the buried doped region 104.

FIGS. 4A to 4I are cross-sectional views illustrating steps of a method of manufacturing a silicon carbide semiconductor power transistor according to a second embodiment of the disclosure.

Figure 4A:
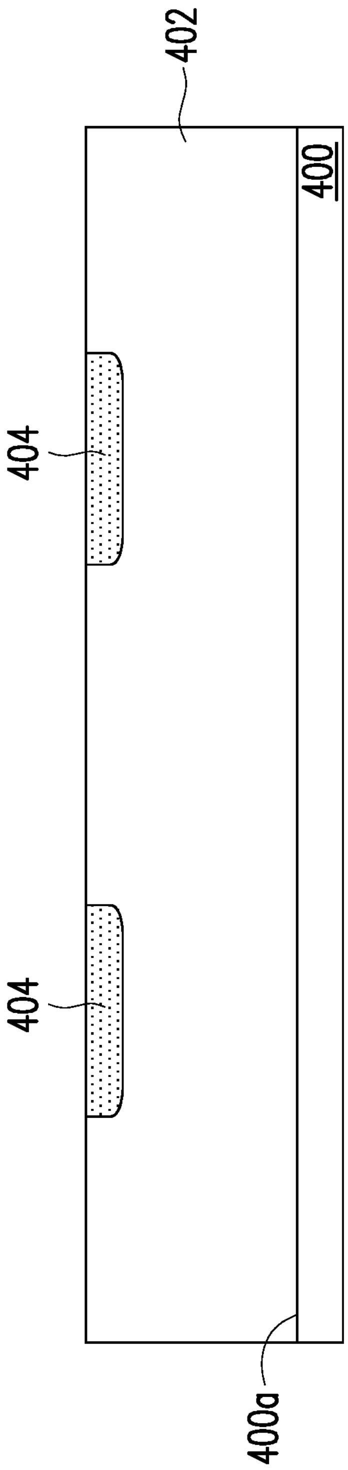
FIGS. 4A to 4I are cross-sectional views illustrating steps of a method of manufacturing a silicon carbide semiconductor power transistor according to a second embodiment of the disclosure.

Referring to FIG. 4A, a silicon carbide (SiC) substrate 400 is utilized, and the SiC substrate 400 may be an n type substrate. A first drift layer 402 is formed on an upper surface 400*a* of the SiC substrate 400, and the first drift layer 402 may be an N-drift layer, wherein the doping concentration of the first drift layer 402 is 5E14/cm$^3$ to 1E17/cm$^3$, and the thickness of the first drift layer 402 is 4 μm to 20 μm, for instance. However, the disclosure is not limited herein. The upper surface 400*a* of the SiC substrate 400 may be a {0001} plane, a {11-20} plane, or a {1100} plane. The upper surface 400*a* of the SiC substrate 400 has an off-axis orientation equal to 5° or less. A plurality of buried doped regions 404 is formed in the first drift layer 402, and the buried doped regions 404 are parallel to each other. The method of forming the buried doped regions 404 may be a doping step using a patterned photoresist (not shown) covered a portion of the first drift layer 402.

Figure 4B:
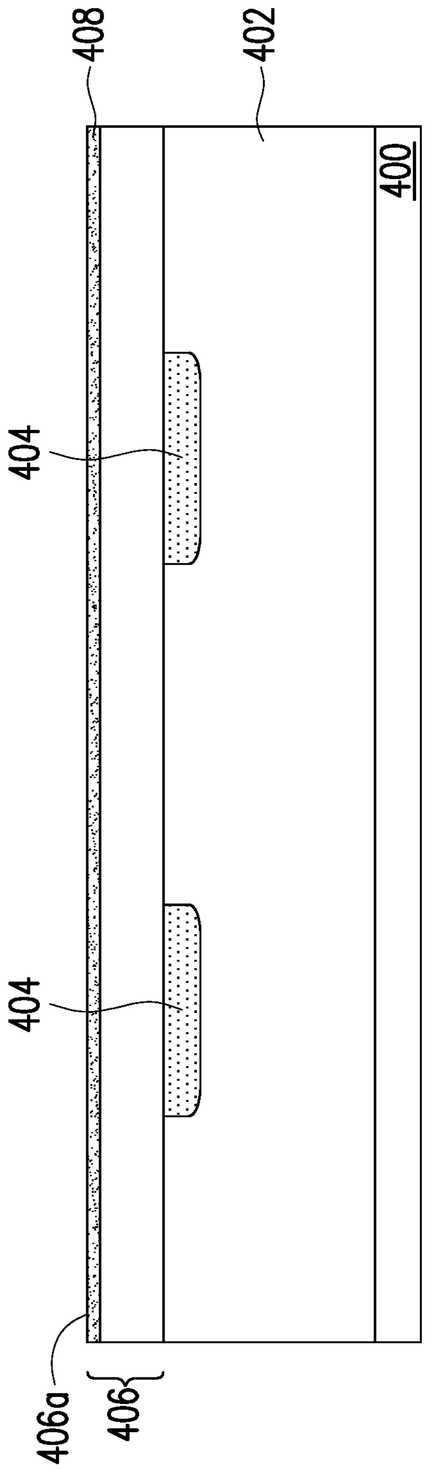

Then, referring to FIG. 4B, a second drift layer 406 is formed on the first drift layer 402 to cover the plurality of buried doped regions 404, and the doping concentration of the second drift layer 406 may be the same or higher than that of the first drift layer 402. In one embodiment, the doping concentration of the second drift layer 406 can be 1.2 to 3 times of the doping concentration of the first drift layer 402 due to the presence of the buried doped regions 404. The thickness of the second drift layer 406 is 1 μm to 3 μm, for instance. A delta doping layer 408 is then formed in a surface 406*a* of the second drift layer 406 entirely. The thickness of the delta doping layer 408 is 1,000 Å to 3,000 Å, and the doping concentration of the delta doping layer 408 is 1E17/cm$^3$ to 5E18/cm$^3$, for instance. The dopants implanted in the delta doping layer 408 is at least one selected from Si, Ge, and Sn, for instance.

Figure 4C:
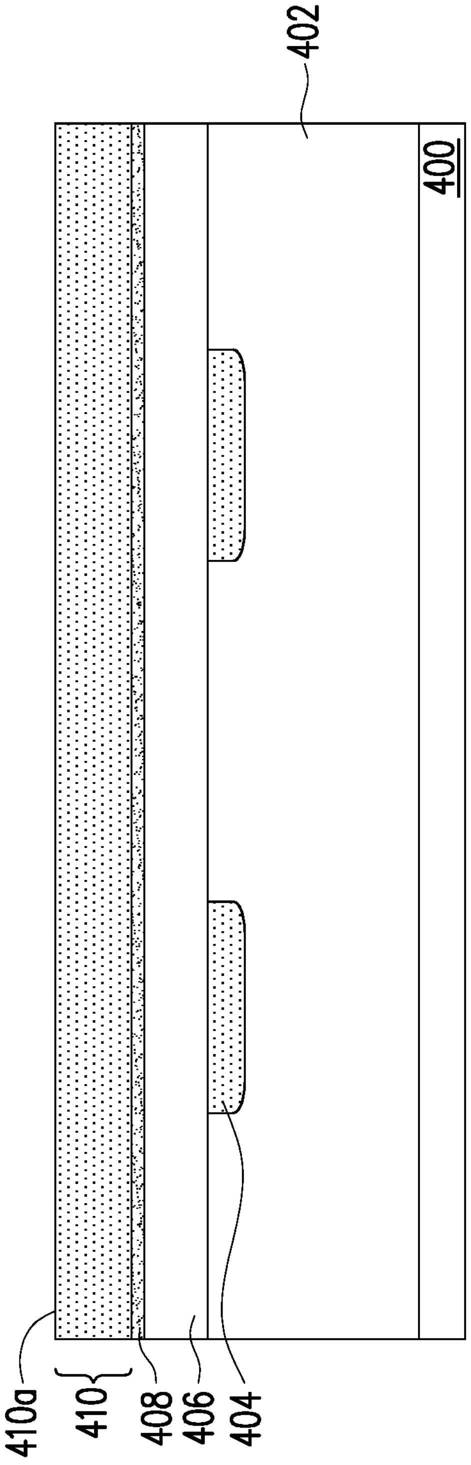
Figure 5:
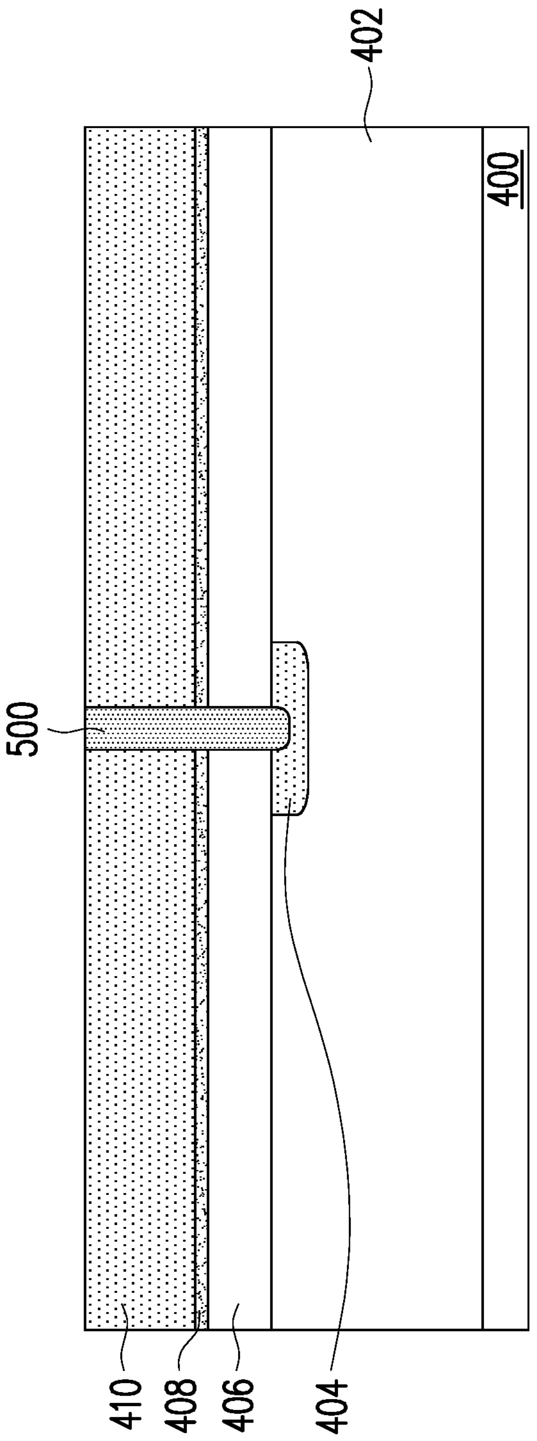
FIG. 5 is a cross-sectional view illustrating a step of FIG. 4C along a different section line.

Then, referring to FIG. 4C, a doped epitaxy layer 410 as a well region is formed on the delta doping layer 408, wherein the doping concentration of the well region (i.e. the doped epitaxy layer 410) is, for instance, ranged from 5E15/cm$^3$ to 1E18/cm$^3$, and the thickness (or depth) of the well region is, for instance, 0.5 μm to 1.5 μm. However, the disclosure is not limited herein. A strap of doped region 500 is then formed through the doped epitaxy layer 410 from a surface 410*a* of the doped epitaxy layer 410 to the plurality of buried doped regions 404 as shown in FIG. 5. In the second embodiment, the doped epitaxy layer 410 is p type, and then the strap of doped region 500 is also p type. The method of forming the strap of doped region 500 may be a doping step using a patterned photoresist (not shown) covered a portion of the doped epitaxy layer 410. The doping concentration of the strap of doped region 500 is ranged from 2E19/cm$^3$ to 1E20/cm$^3$, for instance. In FIG. 5, the strap of doped region 500 extends into the buried doped region 404, but the disclosure is not limited herein; in another embodiment, the strap of doped region 500 may be only formed into the second drift layer 406 and in direct contact with a top of the first drift layer 402.

Figure 4D:
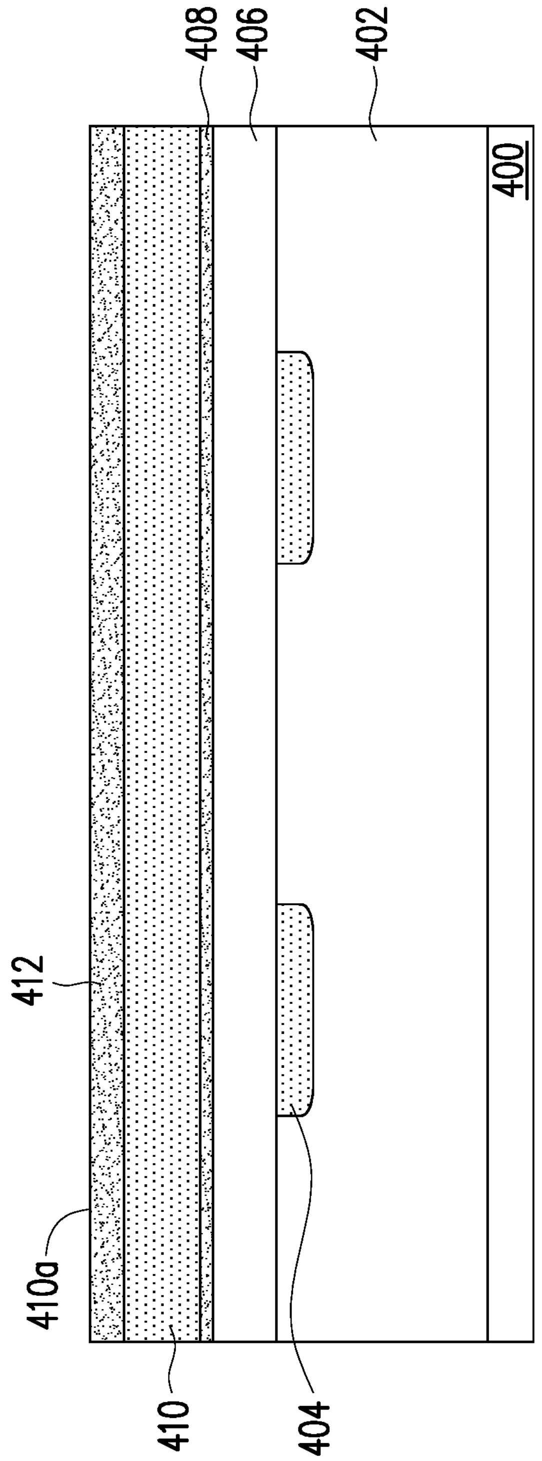

Thereafter, referring to FIG. 4D, a source region 412 is formed in the surface 410*a* of the doped epitaxy layer 410, wherein the source region 412 and the buried doped regions 404 are electrically connected via the strap of doped region 500 as shown in FIG. 5. The doping concentration of the source region 412 is 1E17/cm$^3$ to 1E19/cm$^3$, for instance.

Figure 4E:
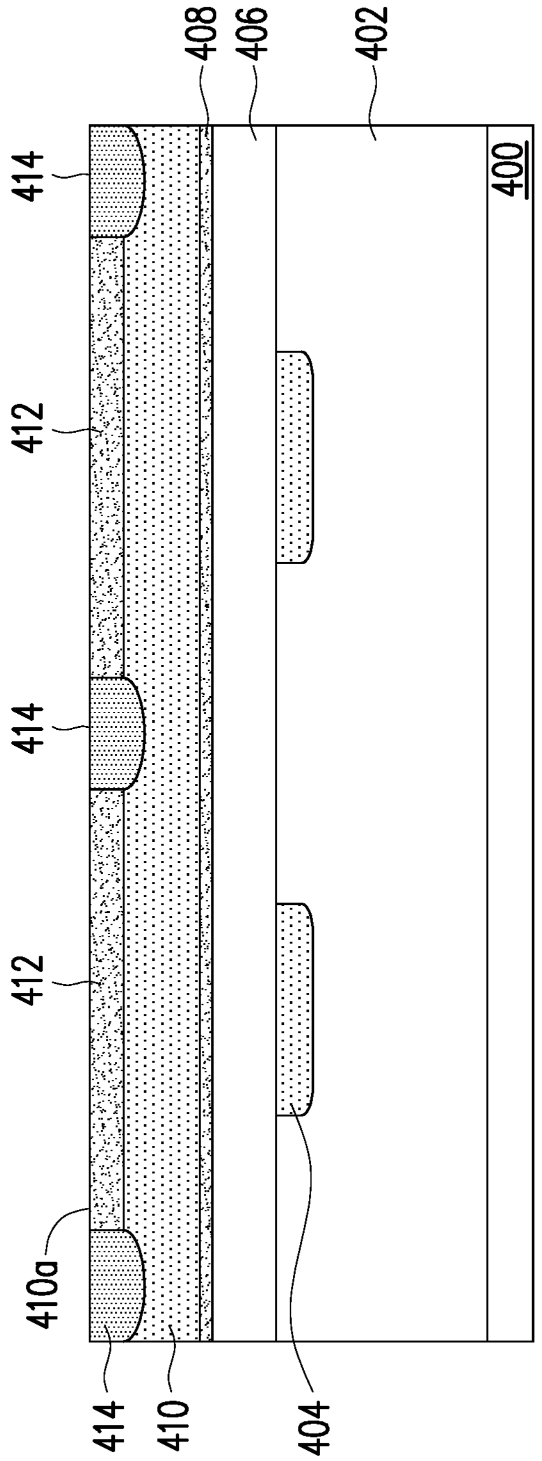

Then, referring to FIG. 4E, a plurality of well pick-up regions 414 is formed in the surface 410*a* of the doped epitaxy layer 410 between the buried doped regions 404 to pass through the source region 412 and contact with the well region (i.e. the doped epitaxy layer 410). The doping concentration of the well pick-up regions 414 is 1E18/cm$^3$ to 2E20/cm$^3$, for instance. The method of forming the well pick-up regions 414 may be a doping step using a patterned photoresist (not shown) covered a portion of the surface 410*a*.

Figure 4F:
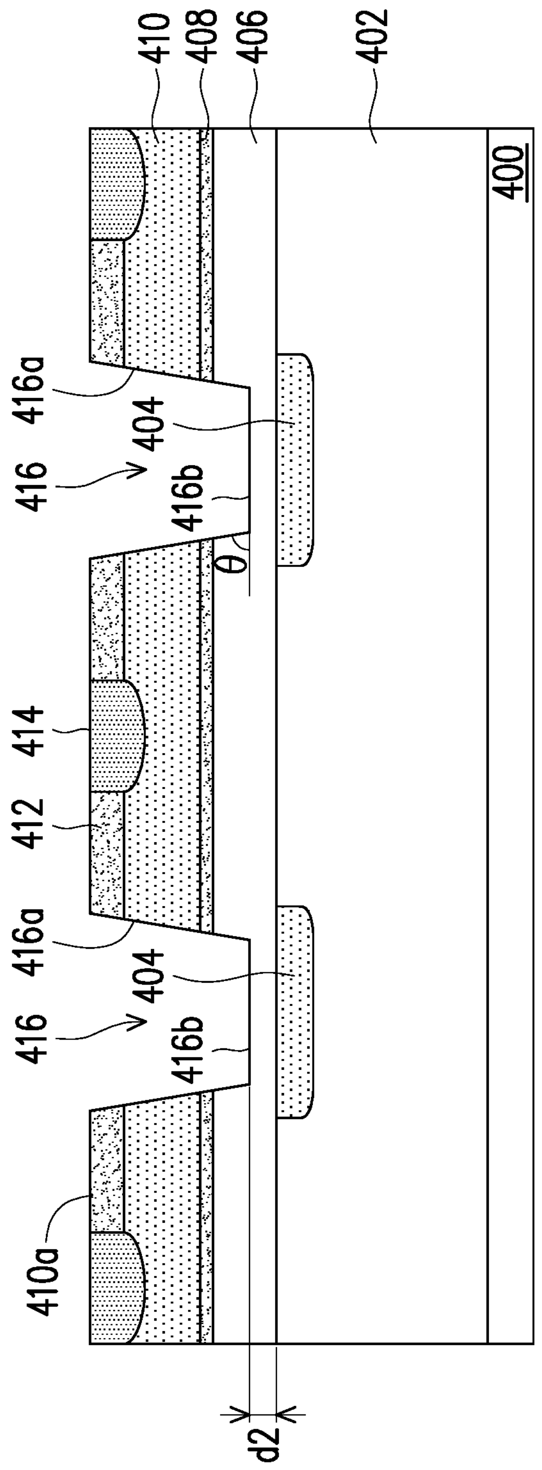

Thereafter, referring to FIG. 4F, a plurality of V-grooves 416 is formed in the doped epitaxy layer 410 and the second drift layer 406 over the buried doped regions 404, wherein the V-grooves 416 pass through the source region 412, the well region (i.e. the doped epitaxy layer 410), and the delta doping layer 408. Each of the buried doped regions 404 is a predetermined distance d2 from a bottom 416*b* of each of the V-grooves 416. The step of forming the V-grooves 416 includes forming a tilt angle θ of 30° to 65° between a sidewall 416*a* and the bottom 416*b* of each of the V-grooves 416. From the perspective of MOSFET $RDS_{on}$, channel orientation in (03-38) plane has positive effect on weak inversion threshold voltage and channel mobility, and thus the sidewall 416*a* may be a (03-38) plane. The (03-38) plane represents the face tilted by 54.7° toward the direction from (0001) plane and tilted by 35.3° toward the direction from (1120) plane.

Figure 4G:
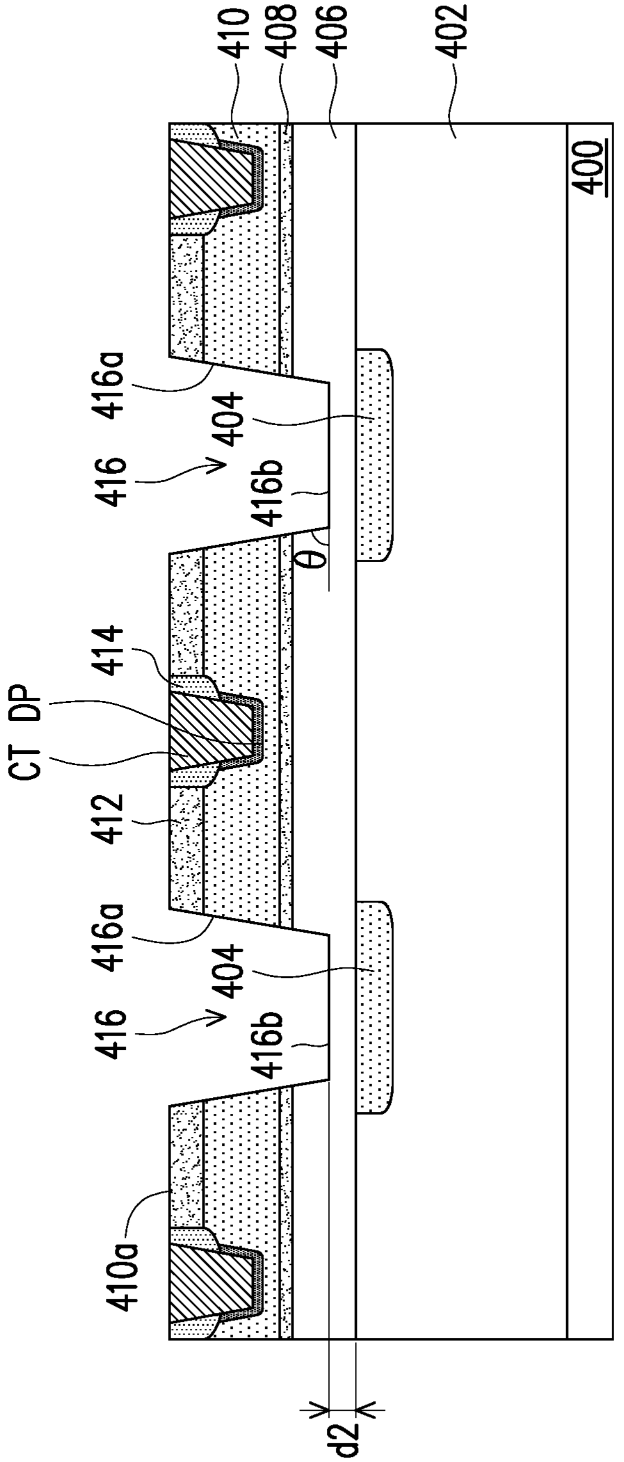
Figure 6:
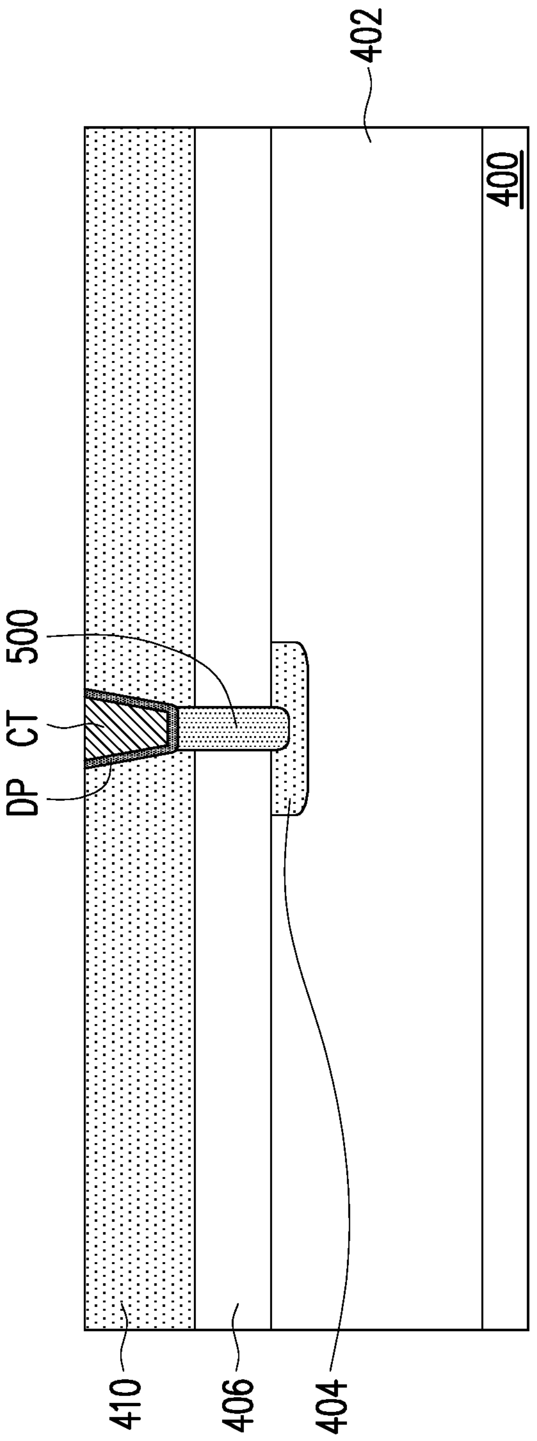
FIG. 6 is a cross-sectional view illustrating a step of FIG. 4G along the different section line.

After that, referring to FIG. 4G, a plurality of conductive trenches CT is formed in the second drift layer 406 to pass through the plurality of well pick-up regions 414 and contact with the well region (i.e. the doped epitaxy layer 410). A plurality of doping portions DP is formed on sidewalls of the plurality of conductive trenches CT in the doped epitaxy layer 410. In particular, the plurality of conductive trenches CT may be formed by etching the second drift layer 406 to form a plurality of recesses and expose a portion of the doped epitaxy layer 410, performing a doping step to form the plurality of doping portions DP on sidewalls of plurality of recesses, and then filling a conductive material in the plurality of recesses. In one embodiment, the doping step for the doping portions DP may using 1.2 MeV Al implantation, and the doping concentration of the doping portions DP is ranged from 1E19/cm$^3$ to 5E19/cm$^3$, for instance. During the step of forming the plurality of conductive trenches CT and the plurality of doping portions DP, a protection layer (not shown) may cover the V-grooves 416 and the surface 410*a* except for the position of the plurality of conductive trenches CT. At the same time, the plurality of conductive trenches CT and the plurality of doping portions DP are also formed above the strap of doped region 500 as shown in FIG. 6 along the same section line of FIG. 5.

Figure 4H:
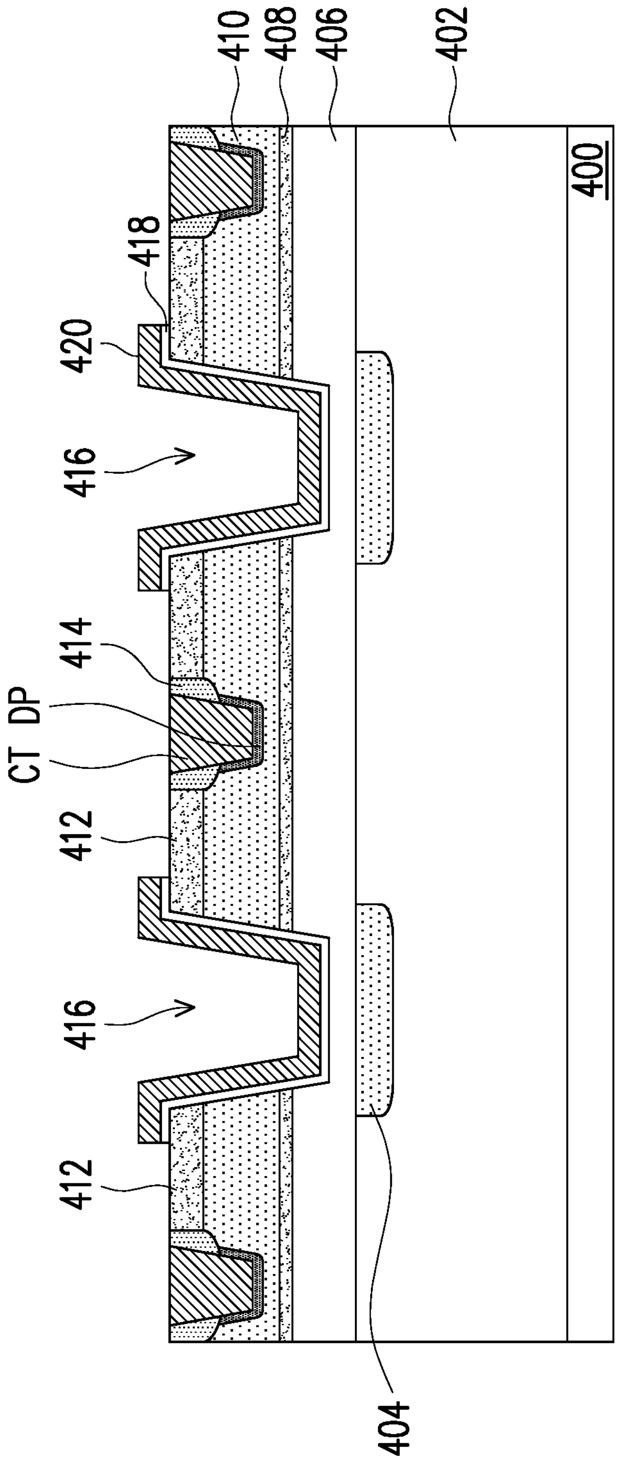

After that, referring to FIG. 4H, a gate insulation layer 418 and gates 420 thereon are formed in each of the V-grooves 416. The gate insulation layer 418 may be a gate oxide with a thickness ranged from 250 Å to 1,000 Å. The method of forming the gate insulation layer 418 and the gates 420 may include forming an entire gate oxide layer and a polysilicon layer orderly, and then etching the polysilicon layer and the gate oxide layer using a patterned photoresist (not shown) covering the V-grooves 416 as an etching mask. In FIG. 4H, the gates 420 extend to the top of the source region 412 outside the V-groove 416, but the disclosure is not limited herein; in other embodiment, the gates 420 may not extend to the top of the source region 412.

Figure 4I:
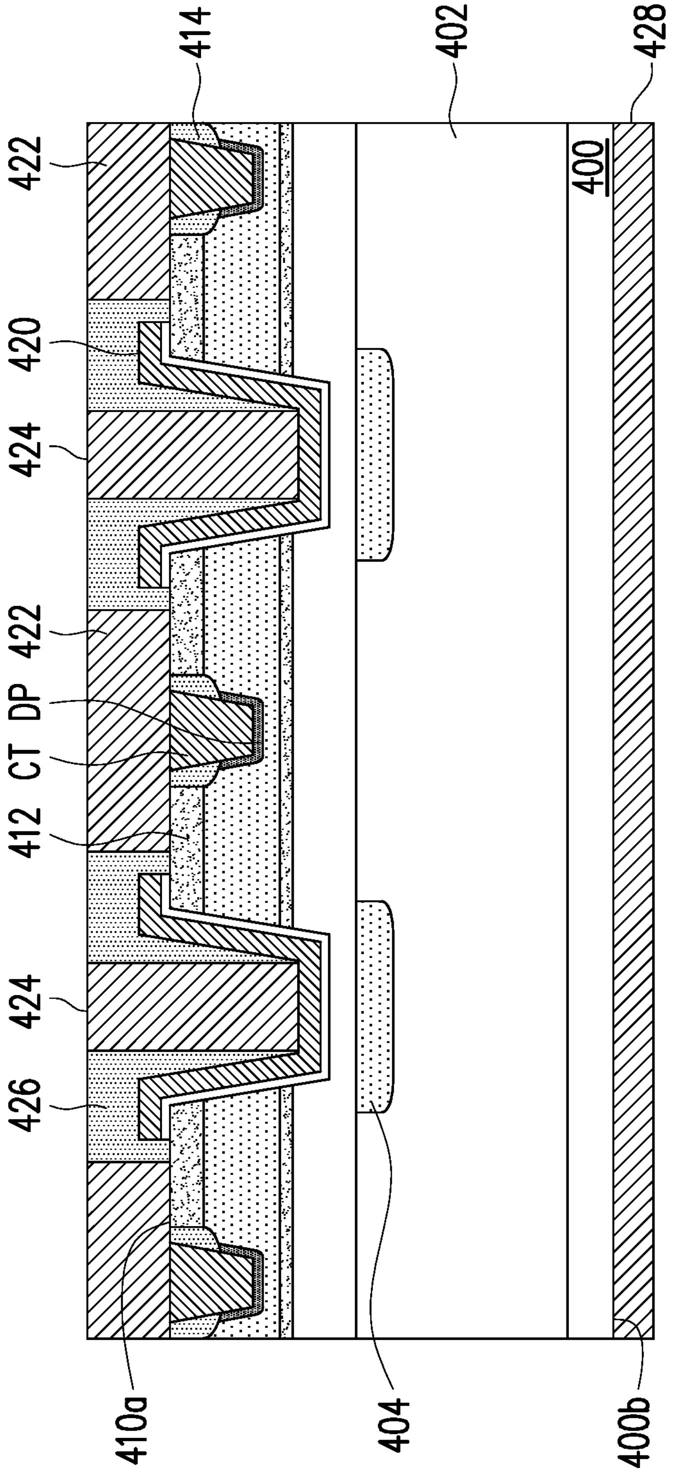

Then, referring to FIG. 4I, source electrodes 422 and gate electrodes 424 are formed together. The source electrodes 422 are disposed on the surface 410*a* of the doped epitaxy layer 410 to be in direct contact with the plurality of well pick-up regions 414 and the source region 412, and the gate electrodes 424 are disposed on the plurality of gates 420. The method of forming the source electrodes 422 and the gate electrodes 424 may include forming an insulation layer 426 on the surface 410*a* of the doped epitaxy layer 410, etching the insulation layer 426 to form openings exposing the well pick-up regions 414, the source region 412, and the gates 420 respectively, and depositing conductive material (e.g. metal or alloy) in the openings. After forming the source electrodes 422 and the gate electrodes 424, a drain electrode 428 is formed on a bottom surface 400*b* of the SiC substrate 400.

In summary, the silicon carbide semiconductor power transistor according to the disclosure has buried doped regions in the drift layer below the gates. Since the buried doped regions is a predetermined distance from the bottom of the V-grooves in which the gate is formed, the problem of high electrical field below the bottom of the V-groove can be solved. Moreover, the buried doped regions provide extra current flow path to reduce the effective JFET resistance, thereby reducing specific on resistance ($R_{on}$) without compromising breakdown voltage resulting in good reliability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A silicon carbide semiconductor power transistor, comprising:
- a substrate made of silicon carbide (SiC);
- a first drift layer disposed on a plane of the substrate;
- a second drift layer formed on the first drift layer, wherein a plurality of V-grooves is formed in the second drift layer, and the V-grooves are parallel to each other;
- a plurality of buried doped regions disposed in the first drift layer below the plurality of V-grooves, and each of the buried doped regions is a predetermined distance from a bottom of each of the V-grooves;
- a plurality of gates disposed in the plurality of V-grooves of the second drift layer;
- a gate insulation layer disposed between the second drift layer and each of the gates;
- a delta doping layer disposed in the second drift layer, and the V-grooves are across the delta doping layer;
- a well region disposed only on the delta doping layer in the second drift layer, wherein the delta doping layer is in physical direct contact with an entire bottom of the well region to limit a junction profile variation of the well region, the delta doping layer has a first conductive type, and the well region has a second conductive type;
- a plurality of source regions disposed in the well region between the V-grooves, wherein the source regions and the buried doped regions are electrically connected;
- a plurality of well pick-up regions disposed in the second drift layer, and each of the well pick-up regions passes through the source regions and contacts with the well region;
- a plurality of source electrodes disposed on the second drift layer to be in direct contact with the plurality of well pick-up regions and the plurality of source regions;
- a plurality of conductive trenches disposed in the second drift layer, wherein each of the conductive trenches is made of conductive material and in direct contact with each of the plurality of source electrodes, and each of the conductive trenches passes through the well pick-up regions and contacts with the well region; and
- a plurality of doping portions on sidewalls of the plurality of conductive trenches in the well region,
- wherein the V-grooves pass through the well region and the delta doping layer.

2. The silicon carbide semiconductor power transistor of claim 1, wherein the plane of the substrate is a {0001} plane, a {11-20} plane, or a {1100} plane.

3. The silicon carbide semiconductor power transistor of claim 1, wherein the plane of the substrate has an off-axis orientation equal to 5° or less.

4. The silicon carbide semiconductor power transistor of claim 1, wherein a tilt angle between a sidewall and the bottom of each of the V-grooves is 30° to 65°.

5. The silicon carbide semiconductor power transistor of claim 1, wherein the substrate, the first drift layer, the second drift layer, and the source regions have the first conductive type, and the well pick-up regions and the buried doped regions have the second conductive type.

6. The silicon carbide semiconductor power transistor of claim 1, wherein dopants in the delta doping layer are at least one selected from Si, Ge, and Sn.

7. The silicon carbide semiconductor power transistor of claim 1, further comprising a strap of doped region disposed in the first drift layer and the second drift layer to connect the source regions and the buried doped regions.

8. The silicon carbide semiconductor power transistor of claim 7, wherein the strap of doped region has an extension direction perpendicular to an extension direction of the plurality of V-grooves.

9. The silicon carbide semiconductor power transistor of claim 8, wherein the gates are symmetrically disposed on both sides of the strap of doped region.

10. The silicon carbide semiconductor power transistor of claim 1, wherein a doping concentration of the well region is ranged from 5E15/$cm^3$ to 1E18/$cm^3$.

11. The silicon carbide semiconductor power transistor of claim 1, wherein a doping concentration of the plurality of buried doped regions is ranged from 5E15/$cm^3$ to 1E18/$cm^3$.

12. The silicon carbide semiconductor power transistor of claim 1, wherein a width of each of the buried doped regions is 1.5-2.0 times than a width of the bottom of each of the V-grooves.

13. The silicon carbide semiconductor power transistor of claim 1, wherein a depth of an upper surface of the buried doped regions in the first drift layer is 0.2 μm to 1.5 μm, and the predetermined distance is 0.3 μm to 1 μm.

14. The silicon carbide semiconductor power transistor of claim 1, further comprising:
- a plurality of gate electrodes disposed on the plurality of gates; and
- a drain electrode disposed on a back of the substrate.

15. A method of manufacturing a silicon carbide semiconductor power transistor, comprising:

forming a first drift layer on an upper surface of a silicon carbide (SiC) substrate;

forming a plurality of buried doped regions in the first drift layer, and the buried doped regions are parallel to each other;

forming a second drift layer on the first drift layer to cover the plurality of buried doped regions;

forming a delta doping layer in a surface of the second drift layer, wherein the delta doping layer has a first conductive type;

forming a doped epitaxy layer as a well region only on the delta doping layer, wherein the well region has a second conductive type, and the delta doping layer is in physical direct contact with an entire bottom of the well region to limit a junction profile variation of the well region;

forming a strap of doped region through the delta doping layer from a surface of the doped epitaxy layer to the plurality of buried doped regions;

forming a source region in the surface of the doped epitaxy layer, wherein the source region and the buried doped regions are electrically connected via the strap of doped region;

forming a plurality of well pick-up regions in the surface of the doped epitaxy layer between the buried doped regions to pass through the source region and contact with the well region;

forming a plurality of V-grooves in the doped epitaxy layer and the second drift layer over the plurality of buried doped regions, wherein the V-grooves pass through the source region, the well region, and the delta doping layer, and each of the buried doped regions is a predetermined distance from a bottom of each of the V-grooves;

forming a plurality of conductive trenches in the second drift layer to pass through the plurality of well pick-up regions and contact with the well region, wherein each of the conductive trenches is made of conductive material;

forming a plurality of doping portions on sidewalls of the plurality of conductive trenches in the well region;

forming a gate insulation layer in the plurality of V-grooves;

forming a plurality of gates on the gate insulation layer; and forming a plurality of source electrodes and a plurality of gate electrodes on the doped epitaxy layer, wherein each of the plurality of source electrodes is in direct contact with each of the plurality of conductive trenches, each of the plurality of well pick-up regions, and each of the source region.

16. The method of manufacturing a silicon carbide semiconductor power transistor of claim 15, wherein the gate electrodes are disposed on the plurality of gates.

17. The method of manufacturing a silicon carbide semiconductor power transistor of claim 16, wherein after forming the source electrodes and the gate electrodes, further comprising: forming a drain electrode on a bottom surface of the SiC substrate.

18. The method of manufacturing a silicon carbide semiconductor power transistor of claim 15, wherein the upper surface of the SiC substrate is a {0001} plane, a {11–20} plane, or a {1100} plane.

19. The method of manufacturing a silicon carbide semiconductor power transistor of claim 15, wherein the upper surface of the SiC substrate has an off-axis orientation equal to 5° or less.

20. The method of manufacturing a silicon carbide semiconductor power transistor of claim 15, wherein the step of forming the plurality of V-grooves comprises forming a tilt angle of 30° to 65° between a sidewall and the bottom of each of the V-grooves.

* * * * *